(12) United States Patent
Gaudet et al.

(10) Patent No.: US 7,814,402 B2
(45) Date of Patent: Oct. 12, 2010

(54) METHOD AND APPARATUS FOR DIGIT-SERIAL COMMUNICATIONS FOR ITERATIVE DIGITAL PROCESSING ALGORITHMS

(75) Inventors: Vincent Gaudet, Edmonton (CA); Bruce Fordyce Cockburn, Edmonton (CA); Christian Schlegel, Park City, UT (US); Stephen Bates, Canmone (CA); Paul Andrew Goud, Calgary (CA); Robert Hang, Calgary (CA); Anthony Charles Rapley, Saskatoon (CA); Sheryl Howard, Flagstaff, AZ (US)

(73) Assignee: The Governors of The University of Alberta, Edmonton (CA)

( * ) Notice: Subject to any disclaimer, the term of this patent is extended or adjusted under 35 U.S.C. 154(b) by 397 days.

(21) Appl. No.: 11/569,017

(22) PCT Filed: May 13, 2005

(86) PCT No.: PCT/CA2005/000731

§ 371 (c)(1),
(2), (4) Date: Jul. 10, 2008

(87) PCT Pub. No.: WO2005/112272

PCT Pub. Date: Nov. 24, 2005

(65) Prior Publication Data

US 2008/0307292 A1 Dec. 11, 2008

Related U.S. Application Data

(60) Provisional application No. 60/570,901, filed on May 14, 2004.

(51) Int. Cl.
G06F 11/00 (2006.01)

(52) U.S. Cl. .................................. 714/800
(58) Field of Classification Search ......... 714/794–795, 714/800–801, 807
See application file for complete search history.

(56) References Cited

U.S. PATENT DOCUMENTS 7,246,304 B2    7/2007  Kim

FOREIGN PATENT DOCUMENTS

WO    WO03032499    4/2003
WO    WO2004006441    1/2004

OTHER PUBLICATIONS

Wang et al., Graph based iterative decoding algorithm for parity concatenated terllis codes, Mar. 2001, IEEE Trans on Info Theory vol. 47, No. 3, p. 1062 to 1074.*
Hemati et al., Iterative decoding in analog CMOS, Apr. 2003, GLSVLSI, ACM, (retrived from google.com Jun. 4, 2010), p. 15 to 20.*
"A Bit-Serial Approximate Min-Sum LDPC Decoder and FPGA Implementation"; Ahmad Darabiha, Anthony Chan Carusone and Frank R. Kschischang; IEEE 2006; pp. 149-152.

* cited by examiner

*Primary Examiner* — Shelly A Chase
(74) *Attorney, Agent, or Firm* — Gordon & Jacobson, PC

(57) ABSTRACT

An architecture and a method are provided for decoding codewords for codes such as low density parity check (LDPC) codes. An iterative decoding algorithm such as the Belief Propagation Algorithm (BPA) is employed that attempts to correct errors in an input block of symbols via a structure containing two sets of nodes through node processing and the passing of messages between nodes. Message passing and node processing is performed in a digit-serial manner instead of a bit-parallel manner.

43 Claims, 8 Drawing Sheets

METHOD AND APPARATUS FOR DIGIT-SERIAL COMMUNICATIONS FOR ITERATIVE DIGITAL PROCESSING ALGORITHMS

CROSS-REFERENCE TO RELATED APPLICATIONS

This application claims the benefit of and is a National Phase entry of International (PCT) Patent Application Serial No. PCT/CA2005/000731, filed on May 13, 2005.

This application also claims the benefit of U.S. Provisional Patent Application Ser. No. 60/570,901 filed on May 14, 2004, of which International Patent Application Serial No. PCT/CA2005/000731 also claims benefit.

The entire contents of each of the above-referenced applications are incorporated herein by reference.

FIELD OF THE INVENTION

The invention relates to iterative decoders for use in detecting and correcting errors in data.

BACKGROUND

In communication systems it is desirable to minimize the signal-to-noise ratio (SNR), and hence minimize the required transmission power and associated costs, while achieving a specific error rate in the received data after transmission over a noisy communication channel. As well, given a fixed available transmission power, and hence given a fixed SNR, it is desirable to minimize the error rate in the received data. Claude Shannon showed that if a certain minimum SNR limit is exceeded in a communication system, then there exists a coding scheme that ensures error-free communication (C. E. Shannon, "A Mathematical Theory of Communication," Bell System Technical Journal, pp. 379-423 (Part 1) and pp. 623-656 (Part 2), July, 1948). Numerous coding schemes have been devised in attempts to approach the theoretical coding performance limit demonstrated by Shannon (see Shu Lin and Daniel Costello Jr., "Error Control Coding, $2^{nd}$ ed., Prentice Hall, 2004 for a review of the relevant literature). Most conventional communication receivers quantize the received signals into bits or vectors of bits, and then optionally use error control schemes that attempt to detect and correct errors in the received bits. Conventional error control schemes employ algorithms that attempt to identify and correct errors in received bits in a single iteration of computation. Gallager's low density parity check (LDPC) codes (R. G. Gallager, "Low Density Parity Check Codes," IRE Transactions on Information Theory, vol. IT-8, pp. 21-28, January, 1962) have been shown to have error correcting performance that approaches Shannon's limit (see Lin and Costello for a summary of recent results); however, the associated multiple-iteration LDPC decoding algorithm at the receiver is computationally demanding and requires considerable hardware resources, decoding time and energy. These implementation challenges in the iterative decoder have hindered the adoption of LDPC codes. The silicon chip area required by prior art, for example the design described by Blanksby and Howland in "A 690-mW 1-Gb/s 1024-b, Rate-1/2 Low-Density Parity-Check Code Decoder" (IEEE Journal of Solid-State Circuits, vol. 37, no. 3, March 2002, pp. 404-412), is relatively large due in part to the large amount of wiring required by the bit-parallel representation of intermediate binary results. The increasing commercial importance of portable battery-powered communication devices makes it important to seek decoders that minimize the required power consumption, possibly changing the decoding algorithm adaptively in response to changing environmental conditions.

Referring now to FIG. 1, shown is a bipartite probability dependency graph for a block-parallel decoder. The bipartite probability dependency graph contains variable nodes, check nodes, and edges between variable nodes and check nodes that indicate the connection paths taken by variable messages and check messages. The bipartite probability dependency graph for a code of length L will have a set of L variable nodes and a set of T check nodes. Connections exist between the variable nodes and check nodes as defined by a connection matrix, for example a parity check matrix (H) with dimensions T by L. In operation, processing occurs in both the variable nodes and the check nodes in accordance with a BPA (Belief Propagation Algorithm), which is an iterative decoding algorithm for use in detecting and correcting errors in data. The corrected bits recovered by the decoding algorithm are output by the variable nodes after the last iteration.

SUMMARY OF THE INVENTION

According to a broad aspect, there is provided an iterative decoder comprising: at least one check node implementing at least one check node instance; at least one variable node implementing at least one variable node instance; and at least one interconnection between the at least one check node and the at least one variable node, wherein check messages are passed in digit-serial format and variable messages are passed in digit-serial format.

According to another broad aspect, there is provided a method of iteratively decoding comprising: while an iteration termination criteria has not been satisfied: passing variable messages from at least one variable node to at least one check node in digit-serial format; performing a plurality of check node functions; passing check messages from at least one check node to at least one variable node in digit-serial format; and performing a plurality of variable node functions.

According to yet another broad aspect, there is provided an iterative decoder comprising: a plurality of check nodes; a plurality of variable nodes; and a programmable interconnect, wherein: there is a single connection from each variable node and check node to the programmable interconnect, the programmable interconnect being programmable to selectably logically interconnect each variable node to specific check nodes and vice versa; and for each node, any logical interconnections to the node are implemented using bit-serial transmissions over the single connection between the node and the programmable interconnect, with messages to multiple nodes being transmitted in serial.

According to still another broad aspect, there is provided an iterative digital processing apparatus comprising: a plurality of processing nodes of a first type and a plurality of processing nodes of a second type; and a plurality of digit-serial interconnections between the nodes of the first type and the nodes of the second type, wherein messages are passed from nodes of the first type to the nodes of the second type in digit-serial format, and are passed from the nodes of the first type to the nodes of the second type in digit-serial format.

According to yet another broad aspect, there is provided an iterative decoder comprising: at least one check node implementing a plurality of check node instances; at least one variable nodes implementing a plurality of variable node instances; and at least one interconnection between the at least one check node and the at least one variable node, wherein check messages are passed from check nodes to variable nodes in digit-serial format and variable messages are passed from the variable nodes to the check nodes in digit-serial format.

According to still another broad aspect, there is provided an iterative decoder comprising: at least one check node implementing at least one node instance; at least one variable nodes implementing at least one variable node instance; and at least one interconnection between the at least one check node and the at least one variable node, wherein each check message is passed from check nodes to variable nodes in combination parallel and serial format and each variable message is passed from the variable nodes to the check nodes in a combination parallel and serial format.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
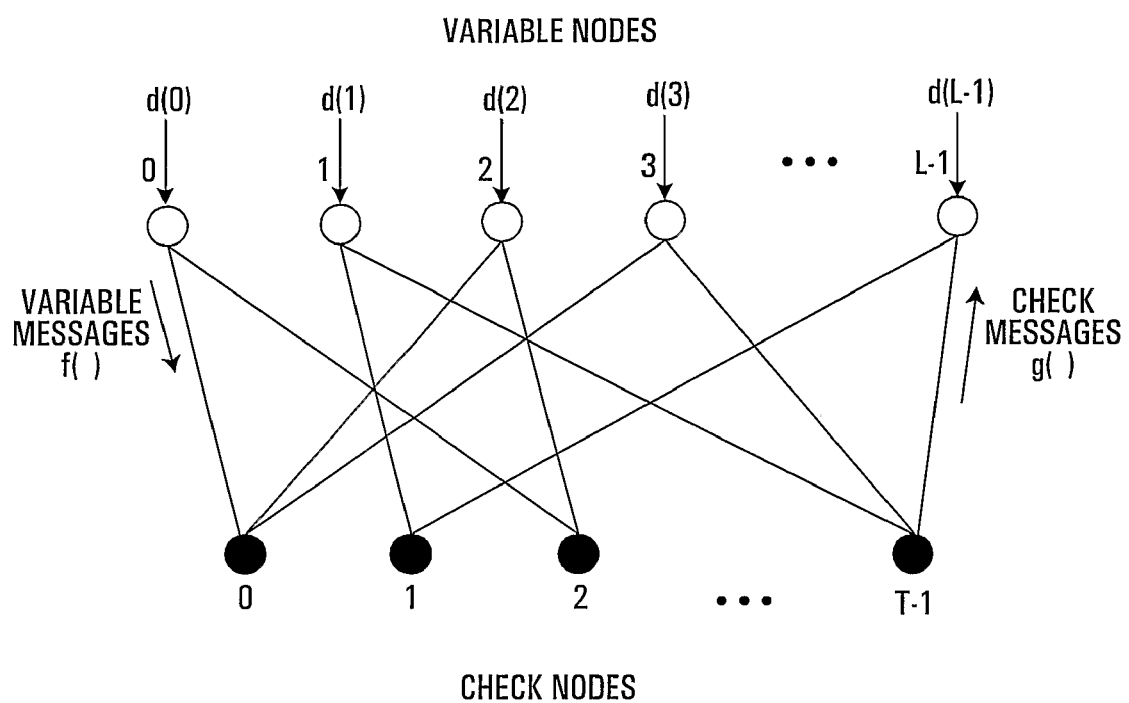
FIG. 1 shows a bipartite probability dependency graph for a decoder.

Hardware implementations of iterative decoders such as the one depicted in FIG. 1 must overcome several obstacles. For example, wiring requirements can be challenging to satisfy and generally increase as the size of the iterative decoder increases. Having a large number of connection wires provides for significant barriers in terms of hardware design cost and achievable performance.

According to one aspect of the invention, messages are passed inside an iterative decoder between check nodes and variable nodes using a bit-serial format instead of the conventional bit-parallel manner. In some embodiments, computation in at least some of the nodes occurs in a bit-serial fashion instead of the conventional bit-parallel manner. However, more generally, check nodes and variable nodes can be implemented using serial components, parallel components, or combinations of serial components and parallel components.

The BPA (Belief Propagation Algorithm) is a soft decision algorithm, which contrasts with hard decision decoding algorithms where input symbols, variable messages, and check messages are thresholded to a single bit only. Therefore, the BPA uses multiple bits to represent the log-likelihood ratios that encode measurements of the input signals, the variable messages and the check messages. Messages can be transmitted with either the MSB (most significant bit) sent first or the LSB (least significant bit) sent first.

Figure 2:
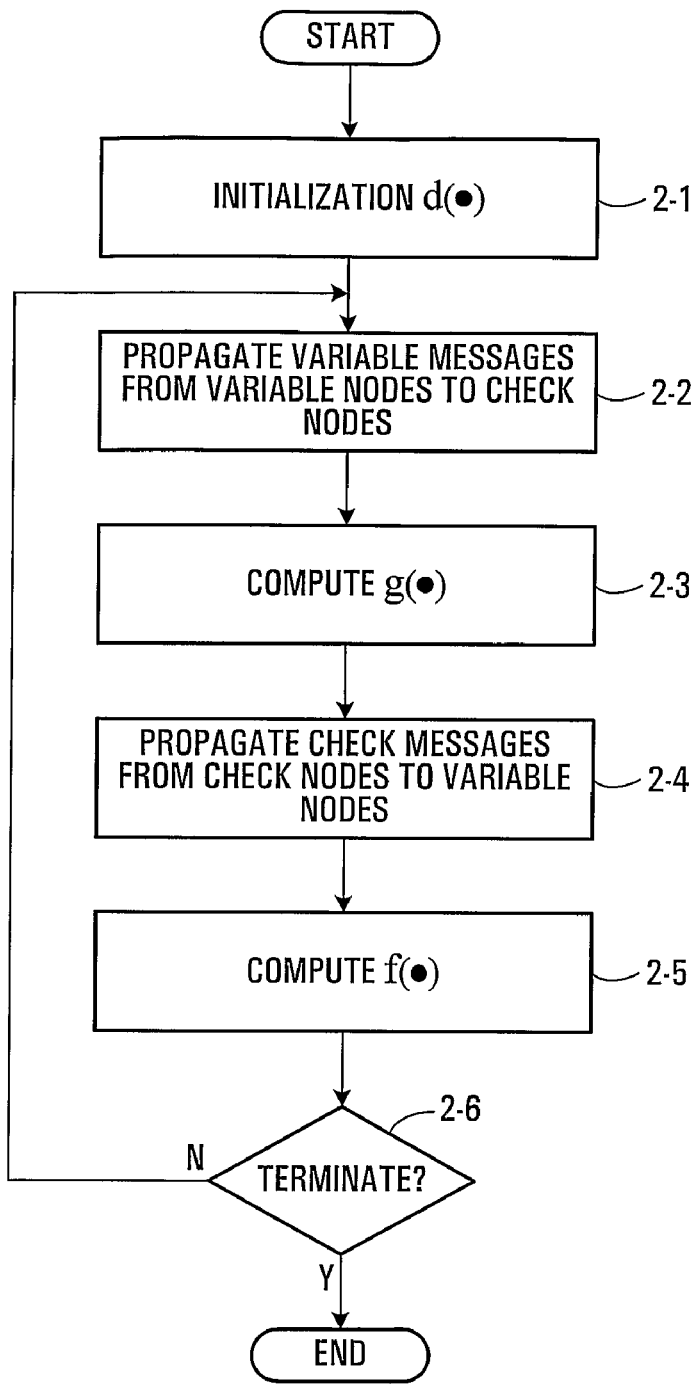
FIG. 2 is a flowchart of an example BPA (Belief Propagation Algorithm) for use in detecting and correcting errors in data.

Referring now to FIG. 2, shown is a flowchart of an example BPA for use in detecting and correcting errors in data. At step 2-1, the BPA is initialized with processing of received symbols according to some function d(●), for example the log-likelihood ratio function applied to measurements of the input signals. As a result of step 2-1 the variable nodes contain stored values, for example log-likelihood ratios, and initial variable messages that are determined by the input symbols. At step 2-2, the BPA propagates variable messages in a digit-serial manner from each variable node to the check nodes that are connected to the variable node. At step 2-3, the variable messages at each check node are processed to form a plurality of check messages according to a function g(●), for example a soft XOR, function. Each check node will then return its check messages in a digit-serial manner to the variable nodes to which it is connected at step 2-4. At step 2-5 the check messages are processed at each variable node to produce a plurality of variable messages as defined by a function f(●), for example an adder function. At step 2-6, the BPA determines whether or not to terminate iterations. If the BPA does not terminate iterations, then iterations continue starting at step 2-2. However, if the BPA terminates iterations, then processing stops. Once iterations have completed, the decoded block of bits is obtained by making a hard decision on the last received check messages and the stored values that are processed in the variable nodes.

There are many ways in which the BPA can determine whether or not iterations should continue. In some embodiments, the BPA will terminate iterations after a set number of iterations. In other embodiments, the BPA will terminate after a defined condition is achieved. In yet other embodiments, the BPA will terminate after at least one of a plurality of defined conditions is achieved.

The check node computations, g(●), and the variable node computations, f(●), can each be implemented using serial components, parallel components, or combinations of serial components and parallel components. In some embodiments, check node computations are performed in a bit-serial manner while variable node computations are performed in a bit-parallel manner as bit-serial implementations of the variable nodes and the check nodes require different representations and bit orderings. Conversion to and from serial form and parallel form may for example be performed using binary shift registers.

Figure 3:
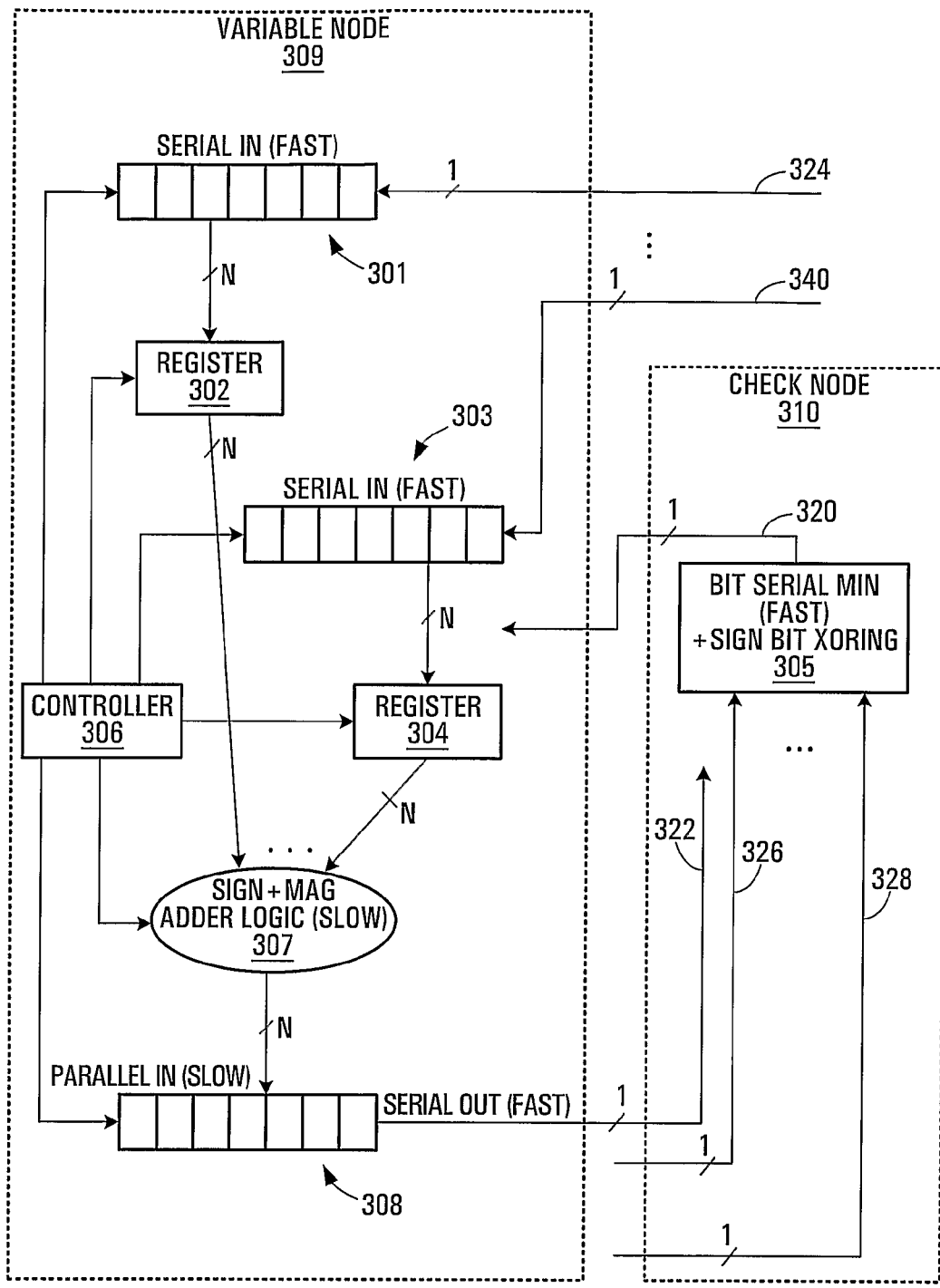
FIG. 3 is a block diagram of an example bit-serial decoder provided by an embodiment of the invention.

Referring now to FIG. 3, shown is an example of a variable node 309 interconnected with a check node 310 as part of a bit-serial decoder provided by an embodiment of the invention. A typical decoder would have a plurality of such variable nodes and a plurality of such check nodes, with connections between pairs of nodes. The bit-serial decoder may for example be implemented in a VLSI (very large scale integration) device such as an ASIC (application specific integrated circuit) or a programmable semiconductor device such as a FPGA (field programmable gate array).

In the illustrated example, there is a first interconnection 320 from the check node 310 to the variable node 309 and a second interconnection 322 from the check node 310 to the variable node 309. Also shown are interconnections 324,340 to the variable node 309 from two other check nodes (not shown), and interconnections 326,328 to the check node 310 from two other variable nodes (not shown). Check node 310 contains a plurality of additional instances (not shown) of bit-serial minimum and sign bit XORing operators similar to 305. Each such instance drives a connection (not shown), similar to connection 320, that goes to different variable nodes other than variable node 309. In addition, each instance of variable node 309 contains a plurality of additional instances (not shown) of the sign and magnitude adder logic 307 together with additional instances (not shown) of shift register 308. Each such instance drives a connection (not shown), similar to connection 322, that goes to different check nodes other than check node 310. A constraint in the preferred aspect of the invention is that if connection 320 goes to variable node 309, then the connections 326,328 going to bit-serial minimum and sign bit XORing operator 305 should exclude the variable message on connection 322 produced by variable node 309. In other words, the check message for a given variable node is computed using all variable messages except the variable message from the given variable node. Connection 320 can be input to other instances (not shown) of sign and magnitude adder logic similar to 307 that may be present in variable node 309. Similarly, if connection 322 goes to check node 310, then the connections 324,340 going to sign and magnitude adder logic 307 should exclude the check message on connection 320 produced by check node 310. In other words, the variable message for a given check node is computed using check messages from all the check nodes except the given check node. Connection 322 can be input to other instances (not shown) of bit serial minimum and sign bit XORing logic similar to 305 that might be present in check node 310.

The variable node 309 has a respective serial-to-parallel converter for each check node that it is connected to. In the illustrated example, serial-to-parallel converter 303 is shown connected to connection 340, and one other such serial-to-parallel converter 301 is shown connected to connection 324. Similarly, there is a parallel-to-serial register 308 the output of which is connected to connection 322. In the illustrated example, connection 322 is connected to check node 310 and is connected to bit serial minimum and sign bit XORing logic (not shown) present in check node 310 that is similar to 305.

Also shown is a respective parallel register 302,304 for each serial-to-parallel register 301,303. These registers 302, 304 are connected to sign and magnitude adder logic 307. FIG. 3 shows only two registers connected to adder logic 307 but in general there could be additional registers connected to 307 formed by additional instances of serial registers and registers similar to 301 and 302 that contain check message data received over connections similar to 324. Finally, there is also a controller 306 coupled to the serial-to-parallel registers 301 and 303 and parallel registers 302 and 304, the sign and magnitude adder logic 307, and the parallel-to-serial register 308. Alternatively, the controller 306 could be located outside variable node 309 and shared among a plurality of variable nodes and a plurality of check nodes. The check node 310 has a bit-serial minimum and sign bit XORing operator 305 connected to a plurality of inputs, each input being connected to an output of a respective variable node. The output of the bit-serial minimum and sign bit XORing operator 305 is connected over connection 320 to variable node 309. The check node 310 contains additional serial minimum and sign bit XORing operators (not shown) similar to 305 that produce output signals that are connected to variable nodes other than variable node 309 over additional connections (not shown) that exit check node 310.

In operation, the variable node 309 computes variable messages as the sum of check messages and stored values, and propagates the variable messages to at least one check node including the check node 310. The serial-to-parallel registers 301 and 303 convert N bits of received check messages from a bit-serial format to a bit-parallel format. The parallel registers 302 and 304 store the received check messages in bit-parallel format until they are added together by the sign and magnitude adder logic 307. The adder logic 307 preferably implements saturated arithmetic that limits the maximum magnitude of any resulting sum. The output of the parallel sign and magnitude adder logic 307 is converted from a bit-parallel format to bit-serial format by the parallel-to-serial register 308 before being propagated to the at least one check node including the check node 310.

The controller 306 performs timing synchronization of the received messages. In particular, it synchronizes when all N bits of the check messages have arrived in serial-to-parallel registers 301 and 303, when to load the parallel registers 302 and 304 from the serial-to-parallel registers 301 and 303, when to load the parallel variable message into the parallel-to-serial register 308 from the parallel sum operator 307, and when all N bits of the variable message have been sent from the parallel-to-serial register 308.

In operation, the check node 310 computes check messages as the minimum of the magnitude of the variable messages with sign bit XORing and propagates the check messages to at least one variable node 309 including the variable node 309. In the illustrated example, the bit-serial minimum and sign bit XORing operator 305 computes the minimum of the variable messages that arrive on connections 326,328 and computes sign bit XORing operations on those variable messages in a serial manner.

Figure 4:
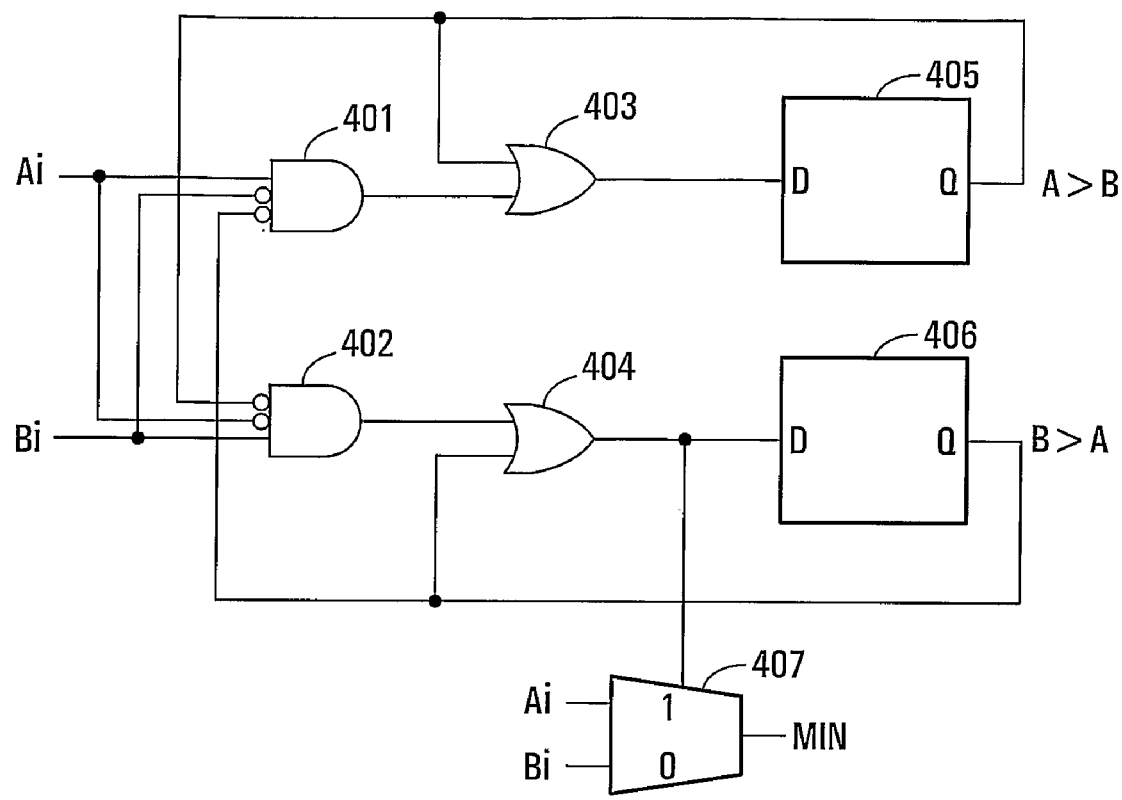
FIG. 4 shows an example implementation of a Bit Serial Min operator that could be used in the check nodes.

All processing inside the check node 310 is performed in a bit-serial manner synchronized according to a controller (not shown) analogous to controller 306 in variable node 309. The bit-serial minimum and sign bit XORing operator 305 uses a sign and magnitude representation and operates bit-serially to XOR the sign bits of all of the inputs and to compute the minimum of the magnitudes starting with the most significant magnitude bit. Referring now to FIG. 4, shown is an example implementation of a Bit Serial Min operator. For the example of FIG. 4, it is assumed that there are two inputs that are connected to two "AND" gates 401,402. The first "AND" gate 401 has an output connected to a first "OR" gate 403, which has an output connected to input D of a first D-flip-flop 405. The second "AND" gate 402 has an output connected to a second "OR" gate 404, which has an output connected to input D of a second D-flip-flop 406. The first "AND" gate 401 has three inputs: a non-inverting input for Ai, a first inverting input for Bi, and a second inverting input for output Q of the second flip-flop 406. The second "AND" gate 402 has three inputs: a non-inverting input for Bi, a first inverting input for Ai, and a second inverting input for output Q of the first flip-flop 405. The first "OR" gate has an input from output Q of the first flip-flop 405 while the second "OR" gate has an input from output Q of the second flip-flop 406. A multiplexer 407 has a selecting input connected to the output of the "OR" gate 404 and two selectable inputs: Ai and Bi.

In operation, the multiplexer 407 outputs the minimum of Ai and Bi in a bit-serial manner while accepting inputs Ai and Bi in a bit-serial manner going in the order from the most significant magnitude bits to the least significant magnitude bits. Prior to inputting the first and most significant magnitude bits, flip-flops 405 and 406 are reset to 0 forcing both signals A>B and A<B to be 0. Starting with the most significant magnitude bit and working down towards the LSB, upon first occurrence of Ai being greater than Bi, the first "AND" gate 401 will have a high output, which will cause the first "OR" gate 403 to have a high output. The output of the first D-flip-flop 405 will be high on the next clock cycle and will stay high for the remainder of the bits being compared as the output of the first D-flip-flop 405 is fed back into the first "OR" gate 403. Similarly, upon first occurrence of Bi being greater than Ai, the output of the second D-flip-flop 406 will be high on the next clock cycle and will stay high for the remainder of the bits being compared.

The multiplexer 407 chooses between Ai and Bi based on the output of one of the "OR" gates, namely "OR" gate 404 in this example. In the event that Ai and Bi are identical signals, the output from the second "OR" gate 404 will be low and the multiplexer 407 defaults to outputting Bi.

The bit-serial minimum circuit depicted in FIG. 4 can be readily extended to handle more than two bit-serial inputs. For example, a bit-serial circuit that determines the minimum of four bit-serial inputs Ai, Bi, Ci and Di could be formed using three instances of the bit-serial min circuit depicted in FIG. 4. The first bit-serial min circuit instance would have its two inputs connected to Ai and Bi and its bit-serial output min(Ai,Bi) would be always be the minimum of Ai and Bi. The second bit-serial min circuit instance would have its inputs connected to Ci and Di and its bit-serial output min(Ci, Di) would be always be the minimum of Ci and Di. The third bit-serial min circuit would have its inputs connected to min (Ai,Bi) and min(Ci,Di) and its output MIN would always be the minimum of Ai, Bi, Ci and Di.

In other implementations of the bit-serial min circuit with greater that two bit-serial inputs, the logic can be redesigned using standard techniques to minimize the implementation cost by sharing hardware. Standard design techniques can also be used to structure the logic gate networks to ensure that the bit-serial output is formed as quickly as possible from the bit-serial inputs.

In other implementations, at least some processing is performed in a bit-parallel manner as bit-parallel logic has more relaxed speed requirements than the serial operations. This may be implemented, for example, by converting the variable messages to a bit-parallel format, computing the minimum of the variable messages in parallel, and converting the result back to a bit-serial format.

The check node sign XOR operation is preferably performed using a dedicated circuit that is distinct from the minimum magnitude circuit. This circuit can simply be a multiple input XOR gate, with sufficient inputs to accommodate all of the bit-serial inputs. The MSBs of the variable messages are sent to the XOR logic while the remaining variable message bits are sent to the minimum magnitude circuit. The outgoing check message bits are thus formed from the XOR result bit followed by the minimum magnitude result bits. The two streams of bits can be merged into the check message bits using a multiplexer.

Variable Node Implementation

Figure 5:
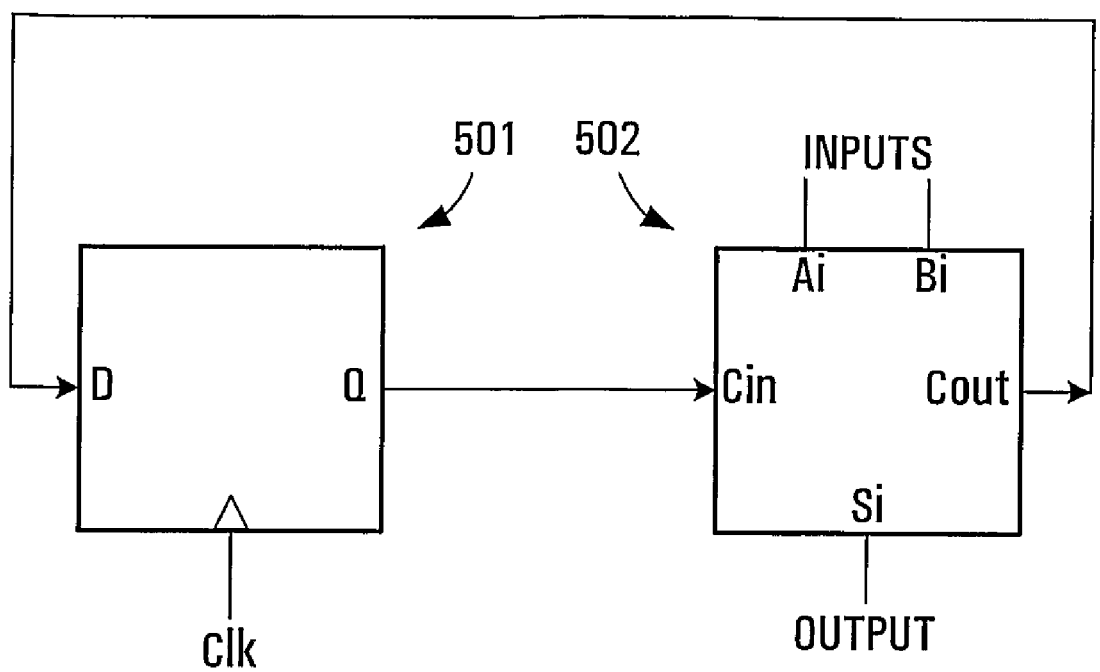
FIG. 5 shows an example implementation of a bit serial adder that operates on operands that are sent LSB (least significant bit) first.

In the example of FIG. 3, processing inside the variable node 309 is performed with conversions to and from bit-serial and bit-parallel in order to perform summation in a bit-parallel form. However, in other implementations, no such conversion is necessary, and the variable node functions in a bit-serial manner. An example implementation that achieves this is shown in FIG. 5 for a case where there are two inputs. The bit-serial adder operates on operands that are sent LSB (least significant bit) first. A full adder 502 has inputs Ai (operand A), Bi (operand B), and Cin (carry in), and outputs Si (sum) and Cout (carry out). A D-flip-flop 501 has an input D connected to Cout of the full adder 502, an output Q connected to Cin of the full adder 502, and a clk (clock) input. A reset signal (not shown) connected to the D-flip-flop 501 is used to force the state of the D-flip-flop 501 to 0 at the start of each summation operation.

In operation, the full adder 502 computes Si and Cout as the sum of Ai, Bi, and Cin for each clock cycle using a 2's complement representation. The D-flip-flop 501 stores the carry bit for one clock cycle so that the current Cin is equal to the last Cout. This allows the full adder 502 to compute Si one bit at a time starting with the LSB. Preferably, 2's complement logic is employed and this takes care of the sign logic for the variable node. However, in some implementations, the check messages may arrive in precisely the reversed bit order. A bit serial adder in the variable node would prefer to receive the LSB first whereas the check node prefers to generate and send the MSB first. In such a situation, some kind of circuit is necessary to reverse the order of the message bits. For example, a first in last out (FILO) register could be used in the variable nodes in place of the serial in shift registers. The check messages would be shifted in their order of arrival from MSB to LSB, and the FILOs would then send the bits from LSB to MSB to the bit-serial adders.

The bit-serial adder depicted in FIG. 5 can be readily extended to accept more than the two bit-serial inputs Ai and Bi. For example, an extended bit-serial adder could compute the sum of the three bit-serial inputs Ai, Bi and Ci. The full adder block corresponding to full adder 502 would need to be replaced with an extended full adder block that accepts the three inputs Ai,Bi,Ci and two carry inputs Cin1,Cin0 stored in two flip-flops that replace flip-flop 501. In this example, the extended full adder block would produce two carry outputs Cout1,Cout2 that would be connected back to the two flip-flops.

Advantages of Bit-Serial Decoder

Various implementations of the bit-serial decoder may have advantages when compared to bit-parallel decoders. One advantage can be substantially reduced wiring requirements. A parallel message passing architecture will typically use check messages and variable messages with a precision of multiple bits. A decoder which uses parallel message passing for a large block code will require message wires in the order of 10000 or more. For example, the Blanksby and Howland LDPC (low density parity check) decoder operated on a 1024 bit long code (L=1024) and had messages with a precision of 4 bits (K=4). Their implementation required 26,624 message wires (3328 graph edges×4 bits/message×2 messages). The bit-serial approach requires only one quarter of the number of message wires for the same LDPC code.

The bit-serial decoder requires K clock cycles to pass messages instead of 1 for the parallel message architecture. However, the bit-serial approach can lend itself to higher clock rates for two reasons. First, since fewer message wires are required, the architecture can be implemented with shorter message wires. Shorter wires mean less latency for the signals since the distance differences will be less and the intrinsic capacitance per wire will be lower. Second, since simpler computations are performed per clock cycle in the bit-serial decoder, less time is required in a single clock cycle to complete computations.

The reduced wiring requirements which are possible with the bit-serial circuits also mean that a specific decoder design (e.g. an L=1024, R=1 LDPC decoder) can be implemented in a smaller area (e.g. in the die of a semiconductor device). With semiconductor devices, a smaller area results in a polynomial reduction in manufacturing cost since manufacturing cost is approximately proportional to the cube of the die area. The smaller area requirements could potentially allow for longer codes (e.g. L=2048) to be implemented in a similar area to current state-of-the-art implementations than are possible for a bit-parallel message passing architecture. Longer codes generally produce better error correcting performance compared to shorter codes.

In addition to the advantages listed above, the bit-serial decoder may consume less power than the bit-parallel decoder. This is extremely advantageous for applications such as mobile wireless devices powered by batteries as reducing power consumption increases battery life or allows the use of smaller and lighter batteries.

Bit-Serial Implementation with Variable Precision

In another embodiment of the invention, the decoder is implemented so as to have a variable precision. In some embodiments, feedback control is used to control the precision used in the decoding process. For example, if the decoder control mechanism observes a high error rate in the decoding process, it commands that messages with higher precision be used; if the controller observes a lower error rate, then a reduced precision can be used in the bit-serial decoder which in turn reduces the number of clock cycles and the amount of energy required to decode each block of data. If the messages are in a bit-serial format, this can be accomplished with no additional wiring in the interconnect between the variable and check nodes. It is noted that if a bit-parallel message format is employed in the interconnect, a switch to a higher message precision cannot be achieved since new wires are required.

Figure 6:
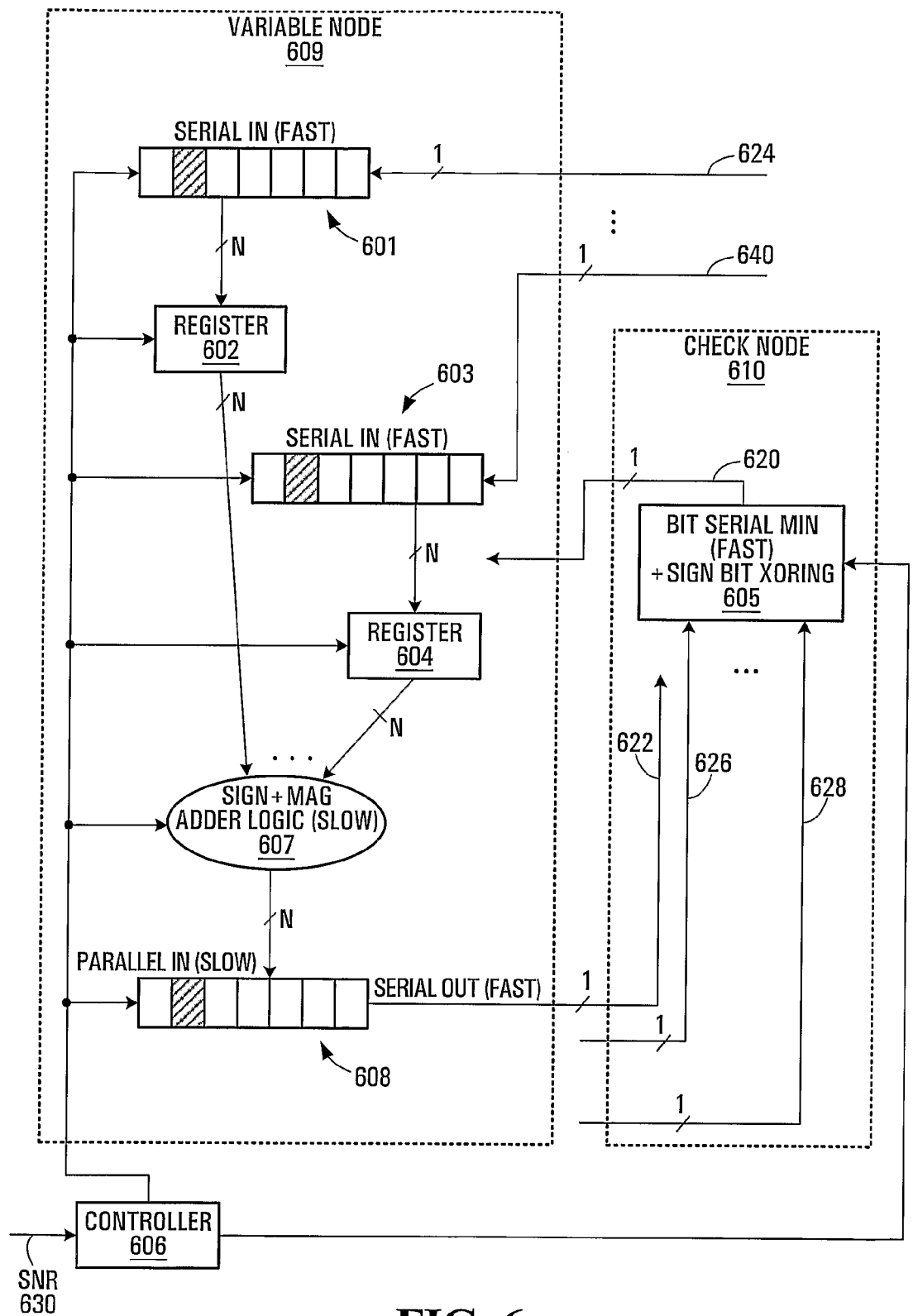
FIG. 6 is a block diagram of an example bit-serial decoder with variable precision messages provided by an embodiment of the invention.

Turning now to FIG. 6, shown is a block diagram of an example bit-serial decoder with variable precision messages provided by an embodiment of the invention. The elements of FIG. 6 are for the most part the same as those of FIG. 3 with corresponding elements numbered 301, 302, 303, 304, 305, 307, 308, 320, 324, 322, 326, 328, and 340 in FIG. 3 being numbered 601, 602, 603, 604, 605, 607, 608, 620, 624, 622, 626, 628, and 640 in FIG. 6. Therefore, their descriptions are not repeated here. With the variable precision implementation of FIG. 6, the controller 306 is replaced with a controller 606 that has a decision criterion input 630. This has an input 630 in the illustrated example, but other decision criteria are contemplated.

The controller 606 is coupled to each variable node, specifically for variable node 609, the coupling is to the serial-to-parallel registers 601 and 603, the parallel registers 602 and 604, the sign and magnitude sum logic 607, the parallel-to-serial register 608. The controller 606 is also coupled to each check node, specifically for check node 610 to the bit-serial min operator 605. The controller 606 receives an SNR (signal to noise ratio) input and/or one or more other decision criterion. In the illustrated example, a single controller could be used for all nodes in the graph. For implementation reasons, however, it might be convenient to have multiple synchronized copies of the same controller distributed within the decoder apparatus in order to minimize the total length and hence total capacitance of control signal connections.

In operation, the controller 606 examines a measured SNR of the received signal and/or some other decision criterion and sets the precision of the bit-serial decoder. The precision setting changes the length of the serial-to-parallel registers 601 and 603, parallel registers 602 and 604, and parallel-to-serial register 608. These registers have been set to a length of five bits in this example. In another example, the decision criterion is the total number of message bits in corresponding messages that changed going from one decoding iteration to the next.

As an example of how the precision of the registers might be changed, the precision could be adjusted at the beginning of each decoding computation and kept fixed for the duration of the computation, or it could be changing dynamically during the computation. If the precision is to be reduced by one bit during the decoding computation, then the incoming shift registers keep their old least significant bit fixed to 0 and the serially incoming bits are shifted into the second most significant bit position instead of the now fixed formerly least significant position. The shift registers then operate as if they were shortened by one bit at the right-most end. Outgoing shift registers produce their serial output bits from the second most significant bit position instead of the formerly least significant bit position. The process of increasing the bit precision involves reconfiguring all of the shift registers so that an additional flip-flop bit appears to the right of the sign bit. This additional bit position is shown shaded in FIG. 6 for shift registers 601,603,608. This new bit allows all of the binary numbers to grow larger in magnitude, regardless of whether the representation is 2's complement or sign plus magnitude. The new bits would be initialized to 0 immediately after the increase in bit width if the sign plus magnitude representation is used; if the 2's complement representation is used then the new bit would be initialized to the value of the sign bit in the corresponding register, using the conventional sign-extension method for 2's complement numbers, so as to avoid changing the represented value of the register contents.

In addition, the timing changes somewhat, with the number of clock cycles needed to complete the processing of a message changing as a function of the precision setting. For example, for a message length of 5, 5 clock cycles are needed for a bit serial MIN operation, whereas for a message length of 7, 7 clock cycles are needed. As a particular example of how timing might be handled, the controller maintains counters that keep track of the number of clock cycles required to process all of the messages in each decoding iteration, and the number of iterations to decode a block of data. If the bit precision of the messages is changed, then the controller changes the number of clock cycles required in each decoding iteration accordingly.

The bit-serial decoder with variable precision messages may, for example, be employed in a receiver of a communications system, which employs FEC (Forward Error Correction).

Programmable Message Interconnections

In another embodiment of the invention, a programmable switch fabric is positioned between the variable nodes and the check nodes. In some embodiments, there is provided an architecture having wires from L variable nodes and T check nodes going to a "patch panel" that can be programmed with different connection configurations according to a connection matrix, for example a parity check matrix (H) with dimensions T by L. This allows the flexibility of using different LDPC codes with different lengths (L) and rates (R).

Figure 7:
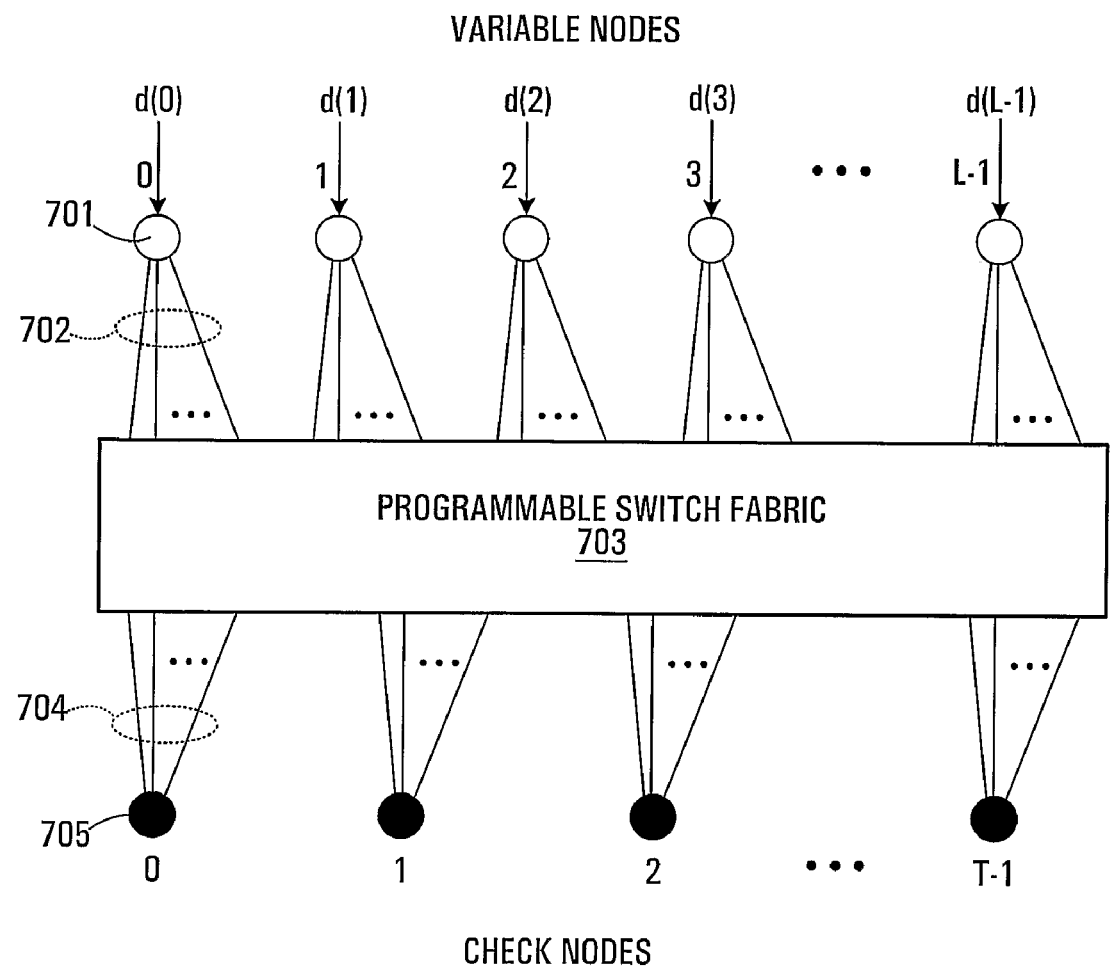
FIG. 7 is a block diagram of an example programmable interconnect circuit.

Turning now to FIG. 7, shown is a block diagram of an example programmable interconnect circuit. A plurality of variable nodes 701 is connected to a programmable switch fabric 703 through a plurality of digital-serial connections 702. A plurality of check nodes 705 is connected to the programmable switch fabric 703 through a plurality of digital-serial connections 704.

In operation, the digital-serial connections 702 and 704 enable bit-serial or bit-parallel signals to be transmitted. The programmable switch fabric 703 can be programmed with different connection configurations so that signals transmitted between variable nodes and check nodes are routed appropriately.

Figure 8:
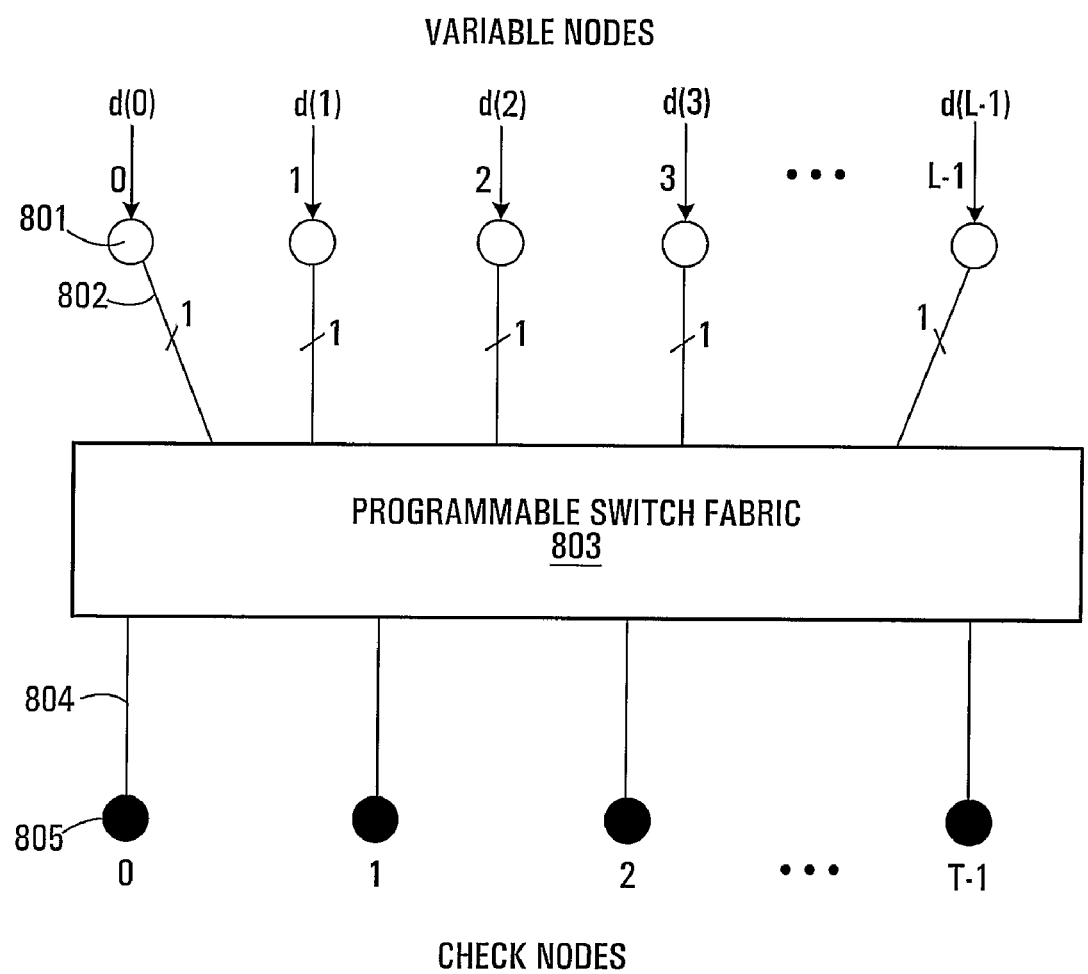
FIG. 8 is a block diagram of an example programmable interconnect circuit with bit-serial and message serial connections for each node.

Turning now to FIG. 8, shown is a block diagram of an example programmable interconnect circuit with a single bit-serial and message serial connection for each node. A plurality of variable nodes 801 is connected to a programmable switch fabric 803 through a plurality of bit-serial connections 802. A plurality of check nodes 805 is connected to the programmable switch fabric 803 through a plurality of bit-serial connections 804.

In operation, the bit-serial connections 802 and 804 enable bit-serial signals to be transmitted. The programmable switch fabric 803 can be programmed with different connection configurations so that signals transmitted between variable nodes and check nodes are routed appropriately. Preferably, FIFOs and registers inside the check nodes and variable nodes are used to buffer messages; new registers would not be required inside the programmable switch fabric, although that is another possible implementation. These FIFOs and registers may for example be the same FIFO and registers as in other embodiments, but the FIFOs and registers for different incoming messages would be loaded at different times in response to new control signals that control which set of FIFOs and registers are active at any given time. The new control signals allow only one message to be shifted into each node at any given time.

Structure Variations

The described embodiments have focussed on iterative decoders implementing a specific BPA for LDPC codes. Therefore, very specific example structures have been described having a MIN SUM decoder. More generally, embodiments of the invention are applicable to any iterative decoder and are not limited by any particular iterative decoding algorithm. The structure of the variable and check nodes is implementation specific and may be different from the particular examples given. Different nodes altogether might be used for other algorithms. For example, other functions could be used in the check nodes instead of the sign bit XORing and minimum magnitude function described earlier. Within the same decoder different functions might be implemented inside different check nodes so that a more complex and more effective check node function can be applied to different and possibly changing check node positions on the bipartite probability dependency graph.

Specific example structures have been described for processing and transmitting bit-serial messages. However, more generally, implementations for processing and transmitting digit-serial messages are possible, bit-serial being one example. Digit-serial messages have digits representing one or more bits. Each digit in the digit-serial format can have a plurality of states. For bit-serial, each "digit" is a bit and can have only two states. For other digit-serial implementations, each digit can have M states, where M>2.

For digit-serial formats where each digit represents more than one bit, the control logic would need to be modified to keep track of the communication and processing of different digits. In digit-serial format, the bit-parallel words can be broken up into different digits. The values of the bits are not changed from the original bit-parallel words; the same bits are just packaged into a plurality of digits instead of a single word. Each digit is then transmitted over a single wire using multi-level signaling, i.e. signaling with more levels than the conventional two-level signaling.

In another embodiment, the bits or digits of a given message are transmitted using a combination of serial and parallel communication. For example, if a 16 bit message is to be transmitted, this might be transmitted by transmitting eight bits in serial on each of two wires (i.e. two parallel streams). This will achieve some but not all of the complexity reduction of a full serial realization.

In some embodiments, a single wire/connection is provided for the interconnection between a variable node and a check node. The direction of traffic changes depending on which node is generating a message at a given instant. In another embodiment, two separate interconnections are provided.

In the embodiments described thus far, it has been assumed that the computations performed in the multiple nodes of an interdependency graph are computed in separate physical nodes. In another embodiment, the computations of multiple variable nodes in the interdependency graph are performed on a single instance of variable node hardware. Similarly, in some embodiments, multiple check node computations in the same iteration could be carried out on a single instance of check node hardware. In yet another embodiment, there may be one or more nodes that can do both check node and variable node calculations at different times, as determined by control commands. An advantage of node multiplexing is that the same hardware would be used to handle much larger codes, where the number of nodes on the dependency graph exceeds the number of available hardware "nodes".

Numerous modifications and variations of the present invention are possible in light of the above teachings. It is therefore to be understood that within the scope of the appended claims, the invention may be practiced otherwise than as specifically described herein.

We claim:

1. An iterative decoder comprising:
   at least one check node implementing at least one check node instance;
   at least one variable node implementing at least one variable node instance; and
   at least one interconnection between the at least one check node and the at least one variable node, wherein check messages are passed in digit-serial format and variable messages are passed in digit-serial format.

2. The iterative decoder of claim 1 comprising a respective check node for each check node instance and a respective variable node for each variable node instance.

3. The iterative decoder of claim 1 wherein at least one of the check nodes implements a plurality of check node instances, and at least one of the variable nodes implements a plurality of variable node instances.

4. The iterative decoder according to claim 1 wherein each digit in the digit-serial format represents a single bit.

5. The iterative decoder according to claim 1 wherein each digit in the digit-serial format has M states where M>2.

6. The iterative decoder according to claim 1 wherein the serial interconnections are disposed according to a connection matrix.

7. The iterative decoder according to claim 1 wherein a single interconnection between each interconnected check node and variable node passes messages in both directions.

8. The iterative decoder according to claim 1 wherein two interconnections are provided between each interconnected check node and variable node to pass messages in two opposite directions.

9. The iterative decoder according to claim 1 wherein each check node is adapted to perform digit-serial processing.

10. The iterative decoder according to claim 9 wherein each check node comprises: XOR circuits that produce the sign bits of each check message from the sign bits of the input messages and bit-serial min operators that produce magnitude bits of each check message from magnitude bits of the incoming messages.

11. The iterative decoder according to claim 1 wherein each check node is adapted to perform bit-parallel processing.

12. The iterative decoder according to claim 1 wherein each variable node is adapted to perform bit-parallel processing.

13. The iterative decoder according to claim 12 wherein each variable node comprises:
- a serial-to-parallel converter for each check node that the variable node is connected to, each serial-to-parallel converter being adapted to convert a check message received from an associated check node from digit-serial form to bit-parallel form;
- a sign and magnitude adder logic generating a variable message in bit-parallel form by summing a stored value and a plurality of the check messages in bit-parallel form;
- a parallel-to-serial converter adapted to convert the variable message in bit-parallel form to digit-serial form, the variable message in digit-serial form being passed to each check node that the variable node is connected to.

14. The iterative decoder of claim 13 wherein the stored value is a log-likelihood ratio.

15. The iterative decoder according to claim 1 wherein each variable node is adapted to perform digit-serial processing.

16. The iterative decoder according to claim 15 wherein each variable node comprises a bit-serial adder.

17. The iterative decoder according to claim 1 wherein the check nodes and the variable nodes accommodate multiple different numbers of digits and the serial messages passed between the check nodes and the variable nodes are adjustable in size.

18. The iterative decoder according to claim 17 further adapted to dynamically adjust the number of digits in the messages as a function of a measured decision criterion.

19. The iterative decoder according to claim 18 wherein the measured decision criterion is a SNR (signal to noise ratio) of a received signal.

20. The iterative decoder according to claim 18 wherein the measured decision criterion is the total number of message bits in corresponding messages that changed going from one decoding iteration to the next.

21. The iterative decoder according to claim 1 further comprising a programmable interconnect, wherein the serial interconnections are via the programmable interconnect, the programmable interconnect being programmable to selectably interconnect the variable nodes to specific check nodes and vice versa.

22. The iterative decoder according to claim 1 adapted to decode LDPC (low density parity check) codes.

23. The iterative decoder according to claim 1 adapted to implement a MIN-SUM decoding algorithm.

24. The iterative decoder according to claim 1 adapted to implement a belief propagation algorithm.

25. A method of iteratively decoding comprising:
while an iteration termination criteria has not been satisfied:
- passing variable messages from at least one variable node to at least one check node in digit-serial format;
- performing a plurality of check node functions;
- passing check messages from at least one check node to at least one variable node in digit-serial format; and
- performing a plurality of variable node functions.

26. The method according to claim 25 wherein each digit in the digit-serial format represents a single bit.

27. The method according to claim 25 wherein each digit in the digit-serial format has M states where M>2.

28. The method according to claim 25 wherein the messages are propagated via connections, the connections connecting the variable nodes and the check nodes according to a connection matrix.

29. The method according to claim 25 further comprising passing messages back and forth between a check node and a variable node on a single connection.

30. The method according to claim 25 further comprising passing messages back and forth between a check node and a variable node on a pair of connections.

31. The method according to claim 25 further comprising:
executing check node functions and variable node functions so as to accommodate multiple different numbers of digits and the serial messages passed between the check nodes and the variable nodes are adjustable in size.

32. The method according to claim 31 further comprising:
measuring a parameter;
dynamically adjusting the number of digits in the messages as a function of the decision criterion.

33. The method according to claim 32 wherein the decision criterion is a SNR (signal to noise ratio) of the messages.

34. The method according to claim 32 wherein the decision criterion is the total number of message bits in corresponding messages that changed going from one decoding iteration to the next.

35. The method according to claim 25 further comprising passing all messages via a programmable interconnect programmed to selectably interconnect variable nodes to specific check nodes and vice versa.

36. The method according to claim 25 further comprising passing all messages via a programmable interconnect via a single connection per function, the programmable interconnect being programmable to selectably logically interconnect variable nodes to specific check nodes and vice versa, with multiple variable node—check node connections being implemented with message serial transmissions on the single interconnections to the programmable interconnect.

37. The method according to claim 25 adapted to decode LDPC codes.

38. The method according to claim 25 adapted to implement a MIN-SUM decoding algorithm.

39. The method according to claim 25 adapted to implement a belief propagation algorithm.

40. An iterative decoder comprising: a plurality of check nodes; a plurality of variable nodes; and a programmable interconnect, wherein:
- there is a single connection from each variable node and check node to the programmable interconnect, the programmable interconnect being programmable to selectably logically interconnect each variable node to specific check nodes and vice versa; and
- for each node, any logical interconnections to the node are implemented using bit-serial transmissions over the single connection between the node and the programmable interconnect, with messages to multiple nodes being transmitted in serial.

41. An iterative digital processing apparatus comprising:
a plurality of processing nodes of a first type and a plurality of processing nodes of a second type; and
a plurality of digit-serial interconnections between the nodes of the first type and the nodes of the second type, wherein messages are passed from nodes of the first type to the nodes of the second type in digit-serial format, and are passed from the nodes of the first type to the nodes of the second type in digit-serial format.

42. An iterative decoder comprising:
at least one check node implementing a plurality of check node instances;
at least one variable nodes implementing a plurality of variable node instances; and at least one interconnection between the at least one check node and the at least one variable node, wherein check messages are passed from check nodes to variable nodes in digit-serial format and variable messages are passed from the variable nodes to the check nodes in digit-serial format.

43. An iterative decoder comprising:
at least one check node implementing at least one node instance;
at least one variable nodes implementing at least one variable node instance; and
at least one interconnection between the at least one check node and the at least one variable node, wherein each check message is passed from check nodes to variable nodes in combination parallel and serial format and each variable message is passed from the variable nodes to the check nodes in a combination parallel and serial format format.

* * * * *